Jan. 30, 1968
R. V. BURNS ET AL
3,366,847
PROXIMITY SWITCH
Filed Oct. 4, 1965
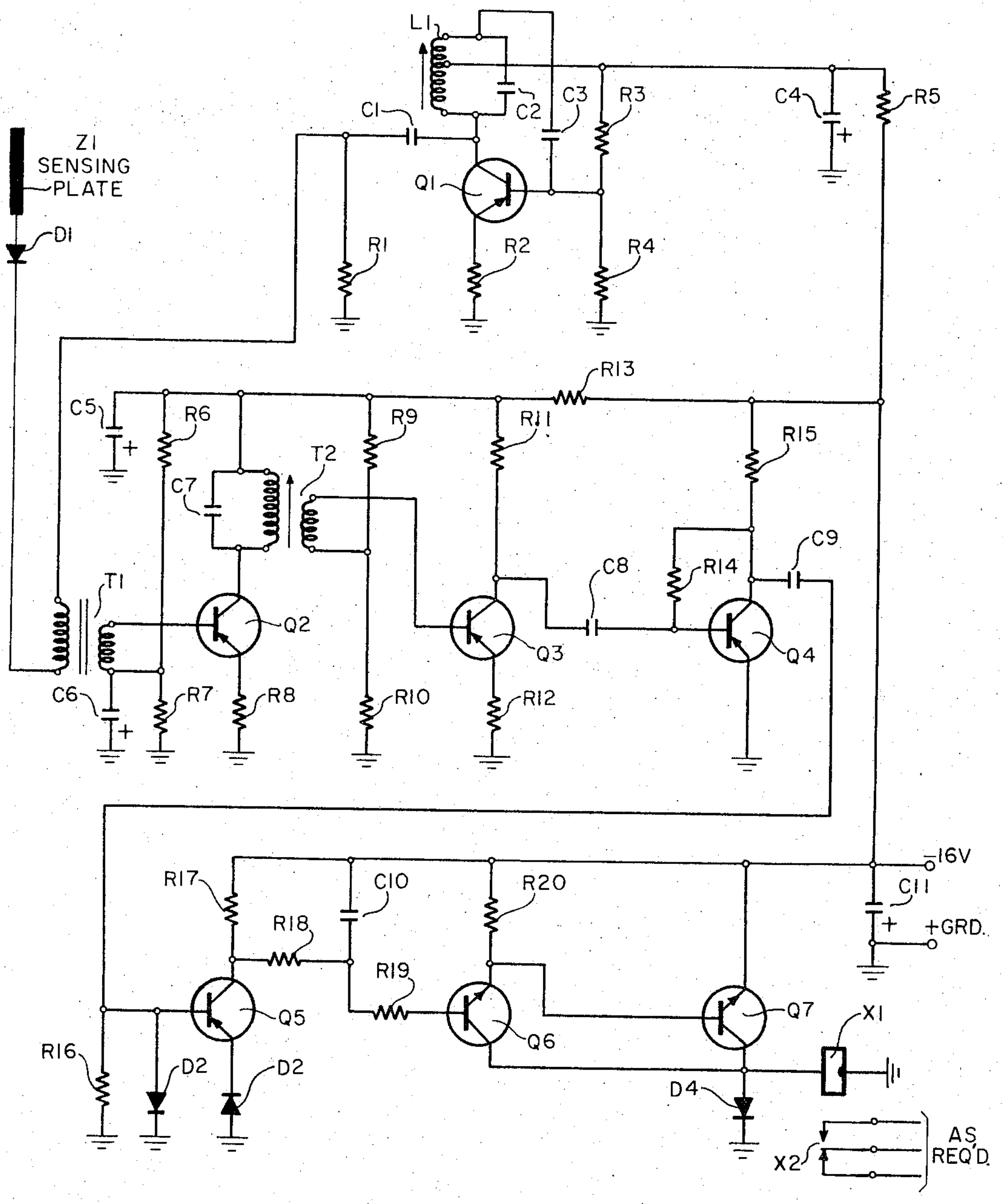
INVENTORS
ROBERT V. BURNS
ROBERT T. CLEARY
BY C. A. Gulbrandsen
ATTY.

United States Patent Office 3,366,847
Patented Jan. 30, 1968

3,366,847
PROXIMITY SWITCH
Robert V. Burns, Markham, and Robert T. Cleary, Lockport, Ill., assignors to Automatic Electric Laboratories, Inc., Northlake, Ill., a corporation of Delaware
Filed Oct. 4, 1965, Ser. No. 492,509
9 Claims. (Cl. 317—146)

This invention relates to switching devices and more particularly to proximity operated switching devices, that may be operated in response to the presence of a person or object in the vicinity of a portion of the switching device.

Capacitance operated proximity switches have long been known. Most common of these contain an oscillator that is adjusted to the point where it will just oscillate. A sensing lead or plate is connected in such a manner that when an object approaches the sensing plate the oscillator is loaded more heavily and ceases to oscillate. Control circuitry is then actuated by stopping oscillation. Such an arrangement can never have long term stability due to the oscillator being just on the ragged edge of operation, any slight change in oscillator supply voltage, oscillator characteristics or other circuit components will cause the oscillator to go into full oscillation or die out completely. The requirement for maintenance of oscillations to be just barely sustained, to maintain the switching device in the ready condition, causes such a device to be extremely critical.

Therefore it is the main object of this invention to provide a reliable switching arrangement of the proximity operated type that requires no adjustment for long periods of time.

Another feature of the instant invention is the provision of proximity operated switching circuitry that may be installed without adjustment.

A further feature of this invention is the inclusion of a proximity switch circuit that is not affected by slight changes in supply voltage or variation or changes in other circuit components.

Further objects and the attending advantages of the invention may be apparent from consideration of the following description taken in connection with the accompanying drawing in which:

The accompanying drawing is a schematic circuit diagram of a proximity operated switching device.

Referring first to the accompanying drawing, the embodiment shown herein consists of: a modified Hartley type oscillator including transistor Q1, an associated tank circuit consisting of inductance L1 and capacitor C2, resistances R1 through R5 and capacitances C1 through C4. The first AC amplifier consisting of transistor Q2, associated resistances R6, R7 and R8, and capacitances C5 and C6. The output of the oscillator stage is coupled to the first amplifier input by transformer T1. The sensing plate Z1 is also coupled by means of transformer T1 to the first AC amplifier stage through diode D1. The output of the first AC amplifier is transformer coupled to the following stage by means of transformer T2. Transformer T2 has its primary winding tuned by means of capacitor C7. The primary is tuned to a frequency twice that of the operating frequency of the oscillator determined by L1 and C2. The secondary of transformer T2 is coupled to the base of transistor Q3 which provides an additional stage of AC amplification, which in turn has its output connected to transistor Q4 which functions as still another stage of amplification. The output of Q4 is capacitively coupled by C9 to the input of the detector or rectifier stage that includes transistor Q5, associated resistances R16, R17 and R18, C10, and diodes D2 and D3. Q5 is directly coupled to a two stage DC amplifier that includes Q6 and Q7, resistances R19 and R20, capacitor C11 and diode D4. The output of the DC amplifier is connected to relay X1.

A better understanding of the present invention will be gained by discussing its operation in connection with the accompanying drawing. In its normal mode the oscillator stage that includes transistor Q1 will furnish a constant stable AC output to amplifier Q2. This output may be in the order of 16 kc. Use of that frequency is neither optimum nor required for operation of this invention, but is merely suggested for purposes of understanding. This frequency is then conduced through transformer T1 to the base of transistor Q2. However, since the output of Q2 is through transformer T2 and the primary winding of T2 is tuned to twice the oscillator frequency (32 kc.) little or no output is extended to Q3. When a hand or other object is placed on or near Z1, the sensing plate, the capacitance or resistance loading at the sensing plate will cause a rectified signal to appear at the primary of transformer T1. Rectification occurs because of diode D1 which is effective to substantially increase the amplitude of higher order harmonics of the basic signal. This characteristic of crystal diode rectifiers is well known. The second harmonic (32 kc.) of the applied signal (16 kc.) when amplified by Q2 will very easily then pass through transformer T2 to be further amplified by the transistor stages that include transistors Q3 and Q4. The signal is then further rectified by transistor Q5 which is biased to act as a diode detector and then additionally amplified by transistors Q6 and Q7 which in turn operate relay X1.

Operation of relay X1 will close associated contacts X2 for control of an external circuit as required. The contact arrangement is shown in the drawing by means of example only and might be varied to add additional contacts depending upon the requirements of the circuit to be controlled.

By way of example a practical embodiment of the present invention has been constructed using the following elements:

| | | |
|---|---|---|
| Transistors Q1–Q4 and Q7 | | Type 2N527 |
| Transistors Q5 and Q6 | | Type 2N1613 |
| Resistance R1 | ohms | 39,000 |
| Resistance R2 | do | 270 |
| Resistance R3 | do | 150,000 |
| Resistances R4 and R17 | do | 12,000 |
| Resistances R5 and R13 | do | 470 |
| Resistances R6, R7 and R9 | do | 47,000 |
| Resistances R8 and R11 | do | 2,200 |
| Resistance R10 | do | 10,000 |
| Resistance R12 | do | 1,200 |
| Resistance R14 | do | 470,000 |
| Resistance R15 | do | 2,700 |
| Resistances R16, R18 and R19 | do | 5,600 |
| Resistance R20 | megohms | 1 |
| Capacitance C1 | microfarads | .0068 |
| Capacitance C2 | do | .1 |
| Capacitances C3, C4, C5 and C11 | do | 22 |
| Capacitance C6 | do | 5 |
| Capacitance C7 | do | .043 |
| Capacitance C10 | do | 10 |
| Diodes D1 and D2 | | Type 1N34 |
| Diodes D3 and D4 | | Type 1N645 |

While the invention has been described with reference to certain embodiments and arrangements, it will be understood that the illustration and description are only for the purpose of disclosure and are not intended to limit the invention.

What is claimed is:

1. A proximity switch for controlling an external circuit comprising: signal generating means operating at a first frequency; switching means connected to said external circuit; coupling means tuned to a frequency different than said first frequency, connected between said signal generating means and said switching means; sensing means, and signal conversion means connected between said sensing means and said coupling means, operated in response to the introduction of an object adjacent to said sensing means, to convert signals from said first frequency to said different frequency, said coupling means operated in response to said different frequency signals to couple said different frequency signals to said switching means, said switching means operated in response to said different frequency signals to control said external circuit.

2. A proximity switch as claimed in claim 1, wherein are further included: first amplifying means having input circuit connections from said signal generating means and said signal conversion means and having output circuit connections to said coupling means.

3. A proximity switch as claimed in claim 2, wherein said proximity switch further includes: a transformer having a primary winding connected to said signal generating means and said signal conversion means and a secondary winding connected to said first amplifying means.

4. A proximity switch as claimed in claim 1, wherein are further included amplifying means connected between said coupling means and said switching means.

5. A proximity switch as claimed in claim 4, wherein are further included: signal rectifying means; and said amplifying means comprise an AC amplifier connected to said coupling means, and a DC amplifier connected to said switching means, and said signal rectification means are included in the circuit path from said AC amplifier to said DC amplifier.

6. A proximity switch as claimed in claim 1, wherein said signal generating means comprise a sine wave oscillator.

7. A proximity switch as claimed in claim 1, wherein said coupling means comprise a transformer having a tuned primary winding.

8. A proximity switch as claimed in claim 1, wherein said signal conversion means comprise a rectifier of semiconductive material.

9. A proximity switch for controlling an external circuit comprising: signal generating means operating at a first frequency; first coupling means connected to said signal generating means; a sensing plate; signal conversion means connected between said sensing plate and said first coupling means; first amplifying means having an input circuit connected to said first coupling means; second coupling means tuned to a frequency different than said first frequency connected to the output of said first amplifier; a second amplifier having its input connected to sai dsecond coupling means; switching means connected to said external circuit; third amplifier means having output circuit connections to said switching means and signal rectifying means connected between the output of said second amplifying means of the input of said third amplifying means; said signal conversion means operated in response to the introduction of an object adjacent to said sensing means to convert signals from said signal generating means to said different frequency, said different frequency signals coupled through said first coupling means to said first amplifying means, said different signals amplified and coupled through said second coupling means to said second amplifying means, said different signals rectified by said rectifying means and further amplified by said third amplifying means to operate said switching means to control said external circuit.

References Cited

UNITED STATES PATENTS

| | | | |
|---|---|---|---|
| 2,490,679 | 12/1949 | Davidson | 317 |
| 3,022,499 | 2/1962 | Ripepi | 340 |
| 3,192,507 | 6/1965 | Sudges. | |
| 3,201,774 | 8/1965 | Uemura | 340—258 |

LEE T. HIX, *Primary Examiner.*